US007033858B2

(12) United States Patent
Chai et al.

(10) Patent No.: US 7,033,858 B2
(45) Date of Patent: Apr. 25, 2006

(54) METHOD FOR MAKING GROUP III NITRIDE DEVICES AND DEVICES PRODUCED THEREBY

(75) Inventors: Bruce H. T. Chai, Oviedo, FL (US); John Joseph Gallagher, Winter Park, FL (US); David Wayne Hill, Orlando, FL (US)

(73) Assignee: Crystal Photonics, Incorporated, Sanford, FL (US)

( * ) Notice: Subject to any disclaimer, the term of this patent is extended or adjusted under 35 U.S.C. 154(b) by 43 days.

(21) Appl. No.: 10/803,467

(22) Filed: Mar. 18, 2004

(65) Prior Publication Data

US 2004/0209402 A1    Oct. 21, 2004

Related U.S. Application Data

(60) Provisional application No. 60/455,495, filed on Mar. 18, 2003, provisional application No. 60/470,814, filed on May 15, 2003.

(51) Int. Cl.
*C30B 25/18* (2006.01)

(52) U.S. Cl. .................. 438/106; 117/101; 117/105

(58) Field of Classification Search ............ 117/101, 117/105, 94, 95; 438/458, 106
See application file for complete search history.

(56) References Cited

U.S. PATENT DOCUMENTS

| 3,959,045 A | 5/1976 | Antypas |
| 5,625,202 A | 4/1997 | Chai ............................ 257/94 |
| 5,724,376 A | 3/1998 | Kish, Jr. et al. |
| 5,834,331 A | 11/1998 | Razeghi ........................ 438/40 |
| 5,917,196 A | 6/1999 | Teraguchi .................... 257/22 |
| 6,043,514 A | 3/2000 | Teraguchi .................... 257/94 |
| 6,072,197 A | 6/2000 | Horino et al. |
| 6,078,064 A | 6/2000 | Ming-Jiunn et al. ........ 257/103 |
| 6,218,280 B1 | 4/2001 | Kryliouk et al. ............. 438/607 |

(Continued)

FOREIGN PATENT DOCUMENTS

DE    199 53 839    5/2001

(Continued)

OTHER PUBLICATIONS

"Growth of M-Plane Gan (1100): A Way to Evade Electrical Polarization in Nitrides" Physica Status Solida (A) Applied Research, vol. 180, No. 1, pp. R1 to R4, 1 to 408, Jul. 16, 2000, Wiley-VCH, ISSN 0031-8965 phys.stat.sol (a), Berlin 180 (2000)1, www.interscience.wiley.com.

(Continued)

*Primary Examiner*—Roy Potter
(74) *Attorney, Agent, or Firm*—Allen, Dyer, Doppelt, Milbrath & Gilchrist, P.A.

(57) ABSTRACT

A method is for making at least one semiconductor device including providing a sacrificial growth substrate of Lithium Aluminate ($LiAlO_2$); forming at least one semiconductor layer including a Group III nitride adjacent the sacrificial growth substrate; attaching a mounting substrate adjacent the at least one semiconductor layer opposite the sacrificial growth substrate; and removing the sacrificial growth substrate. The method may further include adding at least one contact onto a surface of the at least one semiconductor layer opposite the mounting substrate, and dividing the mounting substrate and at least one semiconductor layer into a plurality of individual semiconductor devices. To make the final devices, the method may further include bonding the mounting substrate of each individual semiconductor device to a heat sink. The step of removing the sacrificial substrate may include wet etching the sacrificial growth substrate.

37 Claims, 7 Drawing Sheets

U.S. PATENT DOCUMENTS

| | | | |
|---|---|---|---|
| 6,271,104 B1 | 8/2001 | Razeghi et al. | 438/481 |
| 6,280,523 B1 | 8/2001 | Coman et al. | 117/101 |
| 6,303,405 B1 | 10/2001 | Yoshida et al. | 438/46 |
| 6,350,666 B1 | 2/2002 | Kryliouk | 438/604 |
| 6,380,108 B1 | 4/2002 | Linthicum et al. | 438/791 |
| 6,420,199 B1 | 7/2002 | Coman et al. | 438/22 |
| 6,448,102 B1 | 9/2002 | Kneissl et al. | |
| 6,498,113 B1 | 12/2002 | Solomon et al. | 438/778 |
| 6,518,079 B1 | 2/2003 | Imler | 438/33 |
| 6,521,914 B1 | 2/2003 | Krames et al. | 257/81 |
| 6,534,795 B1 | 3/2003 | Hori et al. | 257/79 |
| 6,630,689 B1 | 10/2003 | Bhat et al. | 257/79 |
| 6,648,966 B1 * | 11/2003 | Maruska et al. | 117/101 |
| 2003/0024472 A1 | 2/2003 | Maruska et al. | |
| 2003/0024475 A1 | 2/2003 | Anderson | 118/715 |
| 2003/0102482 A1 | 6/2003 | Saxler | 257/85 |
| 2003/0180580 A1 | 9/2003 | Wada et al. | 428/698 |
| 2003/0183158 A1 | 10/2003 | Maruska et al. | 117/84 |
| 2003/0198837 A1 | 10/2003 | Craven et al. | 428/698 |

FOREIGN PATENT DOCUMENTS

| | | |
|---|---|---|
| JP | 10215028 | 8/1998 |

OTHER PUBLICATIONS

"Epitaxial Growth and Orientation of GaN on (1 0 0) g-LiAlO2", vol. 2, Article 30, MRS Internet Journal of Nitride Semiconductor Research, 1997 The Materials Research Society.

"Nitride Semiconductors Free of Electrostatic Fields for Efficient White Light-Emitting Diodes", Nature, vol. 406, Aug. 24, 2000, www.nature.com, 2000 Macmillan Magazines Ltd.

* cited by examiner

US 7,033,858 B2
// 1

METHOD FOR MAKING GROUP III NITRIDE DEVICES AND DEVICES PRODUCED THEREBY

RELATED APPLICATION

This application is based upon prior filed copending provisional application Ser. Nos. 60/455,495 filed Mar. 18, 2003 and 60/470,814 filed May 15, 2003, both of which are hereby incorporated herein in their entireties by reference.

FIELD OF THE INVENTION

The present invention relates to the field of semiconductors, and, more particularly, to the manufacture of ultra-thin Group III nitride based semiconductor or electronic devices, such as Light Emitting Diodes (LEDs) and laser diodes, as well as to the associated devices.

BACKGROUND OF THE INVENTION

Group III–V Nitride compound semiconductor devices include both light emitting devices and electronic devices. Light emitting devices may be tailored by film composition to emit light in the range continuously from amber to green, blue and finally ultraviolet. By proper combination with other color light emitting devices or adding phosphors to these devices, it is also possible to generate "white light". The emission pattern of such device may be incoherent, and hence be termed as a "light emitting diode" (LED), or else the emission may be coherent, in which case the device is termed a "laser diode" (LD). The electronic devices may also include high electron mobility transistors (HEMT), heterojunction bipolar transistors (HBT), Schottky, p-i-n and metal-semiconductor-metal (MSM) photodiodes and others.

Sapphire was among the first materials used to grow GaN thin films and to produce blue and green color LEDs. It is often still the material of choice because of its relatively low cost and availability in the commercial marketplace. The brightness of the LEDs made on sapphire is adequate because of the transparency of the sapphire substrate so that the light can be effectively emitted without too much blockage.

Unfortunately, a GaN film on sapphire has a high defect density due to poor lattice mismatching (>17%). An attempted solution for the poor mismatch has been to grow a low temperature buffer layer of AlN prior to the growth of GaN. The GaN layer is grown over the nuclei of AlN which is highly oriented with the c-axis up. Even though the GaN layer is technically polycrystalline it is still suitable to make ordinary LED devices. The typical dislocation density of GaN film on the sapphire with the buffer layer is on the order of $10^{11}$ per cm$^2$, although there is evidence that the dislocation density can be reduced by growing a thicker layer of the GaN film due to grain growth and reduction of grain boundaries. The improvement is limited and it costs more to grow thicker films.

To make high performance devices, sapphire suffers from not being such a good thermal conductor as compared to GaN, AlN, SiC and even Si, for example. As a result, it is difficult to produce high brightness LEDs that require higher current injection and thus more heat generated. Moreover, the bonding of GaN onto sapphire is very strong and difficult to remove, and sapphire is an insulator. Both of these increase the fabrication steps to produce the LEDs. The device size is bigger and the number of diodes produced per unit area is less because both electric leads are on the same side of the diodes.

To make laser diodes (LDs) on sapphire, one suffers the same problems of high defect density and poor thermal conductivity that limit the current density and thus the power output of the laser. Moreover, since the GaN film is composed of polycrystalline grains, it is difficult to produce a smooth surface face for resonating cavities. As a result, the mode structure of the laser is poor.

Another method has been developed to use epitaxial lateral overgrowth (ELOG) to create small regions with a relatively large GaN crystal grain size and low defect density. LDs made from these selected low defect regions indeed show improved performance. Unfortunately, the overall process is complicated and expensive, and the LD yield is very low.

An alternative approach is to use SiC as substrate to grow a GaN thin film. The lattice match of SiC to GaN is much improved (<3.5%) as compared to that of sapphire. The theoretical defect density is also greatly reduced, on the order of $10^9$ per cm$^2$. Perhaps most important of all is that with low lattice mismatching, the GaN film grown on the SiC substrate can be considered as single crystal film as compared to the polycrystalline film on sapphire.

However, growing high quality GaN thin films on SiC wafers does present a number of problems. First, SiC wafers are expensive because the growth of the SiC crystal is difficult. It is produced by a physical vapor transport method at a very high temperature (greater than 2200° C.) using specially designed vacuum sealed reactors. Second, the cutting and polishing processes are also expensive due to the high hardness of SiC being close to that of diamond. Third, the smaller thermal expansion coefficient of SiC ($4.2 \times 10^{-6}$/° C.) relative to GaN ($5.6 \times 10^{-6}$/° C.) is also problematic since it may force the GaN film under tension and cause cracks during cooling after growth.

A special multi-AlGaN layer film may be grown first on the SiC wafer before the final growth of GaN film to reduce such cracking. The same layers also serve the purpose to minimize the band gap offset between SiC and GaN. With such offset minimized, it is possible to use the beneficial feature of electrical conductivity of the SiC substrate to build GaN LEDs with the conventional design. This greatly reduces the size of the LEDs and the yield per unit area is much higher than that made from sapphire. Higher yield compensates for the high cost of substrate material. SiC also has the advantage of high thermal conductivity. This in combination with low defect density should make the LEDs and LDs perform better using the SiC substrate.

Indeed, the intrinsic quantum efficiency of GaN LEDs made on SiC is better than that on sapphire. However, the overall external brightness of GaN LEDs on SiC is worse. This is because that SiC is not as transparent to the emitted light of GaN so that a significant amount of light is blocked. This is particularly true for the UV LEDs. On the other hand, the performance GaN LDs on SiC is much better since good cleaved surfaces are achievable. The beam quality of the laser has much simpler mode structure and more suitable for DVD type of application. The high thermal conductivity of SiC substrate also means that higher current can be applied across the LDs and thus increase the power output.

The result of GaN films on sapphire and SiC points to a common conclusion that to further improve the performance of LEDs and LDs, there is a need to be able to grow low defect density GaN films. In other words, the substrate should have a closely matched lattice constant to that of GaN. Moreover, the substrate should also be transparent and have good electrical and thermal conductivity. At present time, the only substrate that can satisfy all these requirements is single crystal GaN substrate. Unfortunately, the technology to produce such a single crystal GaN substrate may not yet be sufficient.

UNIPRESS of Poland has developed high pressure process to produce true single crystal GaN in thin flake morphology up to a centimeter in size, but this may not be a commercially viable mass production process. There are others, such as ATMI, Lincoln Laboratory of the USA and Samsong of Korea who have successfully produced thick free standing GaN wafers of a few centimeters in size. Unfortunately, mismatched thermal expansion coefficients tend to bend and crack the wafer after growth. To free GaN from sapphire, a laser ablation technique has been used. The removed GaN wafer still needs to be polished to be useful.

Another material with a good potential may be the single crystal AlN substrate. Small single crystals have been produced by a physical vapor transport technique under similar high temperature condition as SiC. The growth process is still under the development stage, and high quality wafers of AlN may not be available for many years to come. Moreover, AlN is an insulator. So device fabrication will face the same constraints as those on sapphire.

Another alternative is to search for a surrogate substrate that has good lattice matching to GaN. After the growth of the GaN films on this substrate the surrogate substrate may be removed to obtain a free-standing single crystal GaN film. If the GaN film has adequate thickness, it will be strong enough and can then be used as substrate wafers for manufacture GaN LEDs and LDs. Sumitomo, for example, uses GaAs as a surrogate substrate in combination with ELOG technology and is able to produce two inch diameter free-standing GaN wafers. The GaAs substrate is removed by chemical etching after the growth of thick film of GaN. Since the GaN surface is very rough after growth, polishing is needed to produce smooth surface. The overall process is still complicated and the cost of the wafer is high. Sumitomo's free-standing GaN wafer is c-face (0001) oriented. Because of the large lattice misfit (>45%) between GaAs and GaN, Sumitomo's free-standing GaN wafer is polycrystalline.

In U.S. Pat. No. 5,625,202, Chai discloses a large class of compounds suitable as substrate materials for the growth of GaN and AlN single crystal films. Among the listed compounds, $LiAlO_2$ (LAO) and $LiGaO_2$ (LGO) show the best potential. This is because large size single crystals of both LAO and LGO can be produced by the standard Czochralski melt pulling technique. The technology to produce large diameter high quality single crystal substrates is ready now and the growth of GaN thin films has been demonstrated on both LAO and LGO substrates.

During the growth process, it is noticed that the compatibility of the chemicals to produce GaN films with an LGO substrate is very poor despite the fact that the two crystals have the best lattice matching and nearly identical crystal structure. The chemicals to grow the GaN film will attack the surface of LGO during growth. Moreover, even if GaN film is able to grow on the LGO substrate, the adherence of the GaN film is very poor so it will inevitably peel off after growth due to mismatch of the thermal expansion coefficients.

LAO has a very different crystal structure and crystal symmetry (tetragonal) from GaN (hexagonal). Nevertheless, the two dimensional (100) surface of LAO has nearly the same structure and lattice dimension as the m-face (1010) of GaN. The lattice mismatch along the a-axis direction of GaN is +1.45%. The lattice mismatch along c-axis direction of GaN is only −0.17%. The chemical compatibility of LAO to the growth chemicals of GaN is also much better. Perhaps most important of all is that LAO wafer can easily be removed after growth with simple acid etching. Utilizing such unique properties free-standing single crystal GaN wafers have been produced with a thickness in the range from 150 up to 500 μm using the HVPE (metal hydrite vapor transport epitaxial growth) method. The single crystal GaN wafer produced from the LAO substrate has the m-face orientation with the index of (1010). It is distinctly different from all the other free-standing GaN wafers available in the market since they all have a c-face orientation with the index of (0001). These wafers are disclosed in U.S. Pat. No. 6,648,966 and published U.S. application No. 2003/0183158, both assigned to the assignee of the present invention, and the entire contents of which are disclosed herein by reference.

The easy removal of the substrate with the simple acid etching is a desirable property that LAO has compared to the more common substrates such as sapphire and SiC. Other potential substrates with the potential of ready removal include GaAs and Si. Both of them have very poor lattice matching (>45% mismatch) to GaN. The ability to free the GaN thin film does provide great flexibility in device design and manufacture.

U.S. Pat. No. 5,917,196 to Teraguchi presents a method for growing GaN-based laser structures on $LiAlO_2$ substrates. They report a violet laser diode emitting at 430 nm with a threshold voltage of 10V. However, they fail to disclose substrate removal so their final device may still have two contacts from above, just like with a sapphire substrate.

When dealing with an insulating substrate such as sapphire, extra steps and thus extra cost are needed to manufacture the LEDs or other devices. To reduce the LED cost, processes were developed to remove the insulating layer so that the device can be manufactured like the conventional GaAs LEDs. They include both mechanical grinding and burning with a short wavelength laser. In both cases, the removal process is very slow and not suitable for mass production. Moreover, the GaN surface after substrate removal is very rough and requires mechanical polishing or reactive ion etching (RIE) to smooth the GaN surface. With this extra effort, a new device structure is produced. This approach has been done by several laboratories and is described below.

Wong et al. have discussed the integration of a blue GaN thin film structure with dissimilar substrates by wafer bonding and lift-off (W. Wong, T. Sands, N. Cheung, etc., Compound Semiconductor Vol. 5, p. 54, 1999). They grow a nitride based device on a sapphire substrate and then use an adhesive to bond the top surface to a silicon wafer. A short wavelength laser is focused through the sapphire onto the back surface of the GaN, and a very thin film of GaN decomposes. Since Ga is a liquid and N is a gas, the sapphire falls away. By dissolving the adhesive, a nitride membrane is formed. This membrane may be transferred to another substrate. If the surface of the membrane is coated with Pd and then In, it can be flipped over and placed on a new substrate also coated with Pd. Heating melts the In, which dissolves in the Pd and forms a strong, permanent bond. A blue-emitting GaN LED has been bonded with the p-side down to a silicon substrate using this technology.

Hewlett-Packard reported transfer of a multi-quantum well nitride LED to a conducting host substrate (Y. K. Song et al, Appl. Phys. Lett., vol. 74, p. 3720, 1999). The device structure was grown by OMVPE on a standard sapphire wafer. Ni/Au contacts were deposited on the top p-type GaN:Mg layer. A copper film was then grown electrochemically on the top surface, and then the sample was flip-chip mounted onto a new host, such as silicon. After the sapphire was removed by laser ablation, a new surface contact was made to the n-type layer. Light emission from the device peaked at 450 nm.

LumiLeds Lighting reported a high-power AlGaInN flip-chip LED design (J. J. Wierer, et al, Appl. Phys. Lett., vol. 78, p. 3379, 2001). The device has a large emitting area (~0.70 mm$^2$) as compared with the conventional small-area (~0.07 mm$^2$) LEDs. The flip-chip design gives the large emitting area. Good thermal contact allows higher current and lower forward voltage and thus higher power conversion efficiencies. Around July 2002, LumiLeds introduced a 1 W Luxeon™ device using a single 1 mm×1 mm LED (425 nm with 259 mW CW at 350 mA, 3.27 V and 22.6% wall plug efficiency, $T_j$=25° C.), and a 5 W Luxeon™ device using 4 single 1 mm×1 mm LEDs (425 nm with 1100 mW CW at 700 mA, 7 V and 22.4% wall plug efficiency, $T_j$=25° C.). In their design, the sapphire substrate still covers the top of the LED. To reduce the sheet current resistance, the p-junction contact is in larger comb shape pad and the n-junction is in a finger shape. RIE (reactive ion etching) with a lithographic pattern is needed to provide the electrical connection.

Xerox reported transfer of a nitride laser to a copper substrate using laser lift-off (W. S. Wong et al, Mat. Res. Soc. Symp. Proc. V. 639, page G12.2.1, 2001). A ridge-waveguide laser structure was grown on a sapphire substrate by MOCVD. Metal contacts in the form of two micron stripes on dry-etched ridges were deposited on the top p-type surface. The structure was then flipped over and attached to a temporary silicon wafer, and then the sapphire was removed by laser ablation. After etching the new n-type GaN surface in HCl, an indium film was deposited on it. The indium was then used to bond the LD membrane onto a copper heat sink, and the temporary silicon substrate was removed.

The University of South Carolina reported using flip-chip bonding of UV-emitting GaN LED onto a silver plated copper header to obtain very high emission intensities at room temperature (A. Chitnis et al, Mat. Res. Soc. Symp. Proc. Vol. 743, p.L7.7.1, 2003), because the copper formed an effective heat-sink, and the silver provided good reflectivity for light traveling downward.

Similar lift-off techniques have been reported for GaAs-based laser structures. Bell Communications Research reported using an intermediate AlAs layer to allow wet etch removal of GaAs substrates from the LD structure (E. Yablonovitch et al, IEEE Phot. Technol. Lett., Vol. 1, p. 41 (1989)). A conventional LD was first grown by MOCVD on a GaAs substrate. Using dilute hydrofluoric acid, the GaAs substrate was removed due to the dissolution of the AlAs, allowing the epitaxial membrane to float free. The membranes, which contained a multitude of LDs, were held by wax as a support. All processing steps, including definition of the laser bars by etching as well as metallization were accomplished prior to lift-off. The structures were then mounted on new glass or silicon substrates, and the wax was removed.

Transparent substrate red AlGaInP LEDs are commercially available. Typically, Hewlett-Packard grows the LED structures on lattice-matched GaAs substrates, but the black GaAs tends to absorb roughly half of the emitted red light. Therefore, after the AlGaInP device is finished, a thick lattice mismatched GaP layer is grown over the top surface to provide a carrier. Although this top carrier is filled with structural defects, the defects do no propagate back into the active region. Then the GaAs substrate is removed by wet chemical etching. The sheet of devices is subsequently placed on a new transparent high quality GaP wafer, and sintered. Individual devices are then cut apart. It has been found that very thin films are difficult to contact and have high spreading resistance problems. Furthermore, a very thin LED chip suffers from problems with light extraction because of waveguiding and hence parasitic absorption problems at contacts and edges. Thus, the attachment of a thick transparent substrate may be very beneficial.

SUMMARY OF THE INVENTION

In view of the foregoing background, it is therefore an object of the present invention to provide a method for making devices, such as light emitting devices, that is relatively straightforward and which produces devices having desired operating properties such as thin active areas and the ability to readily remove heat therefrom.

This and other objects, features, and advantages in accordance with the present invention are provided by a method for making at least one semiconductor device comprising providing a sacrificial growth substrate comprising Lithium Aluminate (LiAlO$_2$); forming at least one semiconductor layer comprising a Group III nitride adjacent the sacrificial growth substrate; attaching a mounting substrate adjacent the at least one semiconductor layer opposite the sacrificial growth substrate; and removing the sacrificial growth substrate. The method may further include adding at least one contact onto a surface of the at least one semiconductor layer opposite the mounting substrate, and dividing the mounting substrate and at least one semiconductor layer into a plurality of individual semiconductor devices. To make the final devices, the method may further include bonding the mounting substrate of each individual semiconductor device to a heat sink, such as comprising indium (In), for example.

More particularly, the step of removing the sacrificial substrate may comprise mechanical grinding and wet etching the sacrificial growth substrate. Accordingly, in some embodiments, the mounting substrate may be selected to be resistant to the wet etching. In other embodiments where the mounting substrate may not be resistant to wet etching, mechanical grinding would be the preferred means to remove the substrate. When wet etching is needed, portions of the mounting substrate may be protected from the wet etching.

The sacrificial growth substrate preferably comprises single crystal LiAlO$_2$, and the at least one semiconductor layer preferably comprises at least one single crystal gallium nitride (GaN) layer. This combination of materials may desirably produce the GaN layer to have an m-plane (1010) orientation.

The step of attaching the mounting substrate may comprise: forming an adhesion layer on the at least one semiconductor layer; and bonding the adhesion layer to the mounting substrate. For example, the adhesion layer may comprise at least one of nickel (Ni) and gold (Au).

The mounting substrate may comprise at least one of copper (Cu), silver (Ag), gold (Au), aluminum (Al), chromium (Cr), nickel (Ni), titanium (Ti), molybdenum (Mo), tungsten (W), zirconium (Zr), platinum (Pt), palladium (Pd), and silicon (Si). The at least one semiconductor layer may be doped. In addition, the method may also include forming a buffer layer between the sacrificial growth substrate and the at least one semiconductor layer; and wherein removing the sacrificial growth substrate further comprises removing the buffer layer.

A very thin active portion may be produced in accordance with the invention. For example, the at least one semiconductor layer may have a thickness of less than about 10 μm. Of course, the semiconductor layer or layers may be selected to emit light upon being electrically biased.

Another aspect of the invention relates to a semiconductor device made in accordance with the above described method. In particular, the device may comprise a heat sink, and a mounting substrate adjacent the heat sink, with the mounting substrate comprising at least one of metal or silicon. The device may also include a plurality of semiconductor layers on the mounting substrate opposite the heat sink and defining at least one p-n junction. The semiconductor layers may preferably comprise a single crystal Group III nitride layer having an m-plane (1010) orientation. The device may also include only one contact on an uppermost one of the semiconductor layers opposite the mounting substrate. The Group III nitride may comprise gallium nitride, for example.

The device may further comprise an adhesion layer between the mounting substrate and the semiconductor layers. The adhesion layer may, in turn, comprise at least one of nickel (Ni) and gold (Au). The bonding material to the mounting substrate may comprise indium (In) or indium based low melting point alloys such as indium-silver or indium-gold. In addition, the mounting substrate may comprise at least one of copper (Cu), silver (Ag), gold (Au), aluminum (Al), chromium (Cr), nickel (Ni), titanium (Ti), molybdenum (Mo), tungsten (W), zirconium (Zr), platinum (Pt), palladium (Pd), and silicon (Si). Of course, the plurality of semiconductor layers may emit light responsive to an electrical bias applied to the metal substrate and the heat sink.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments.

The present invention relates to the Group III nitride compound semiconductor devices. The devices include both light emitting devices and the electronic devices. Light emitting devices may be tailored by film composition to emit light in the range continuously from amber to green, blue and finally ultraviolet. By proper combination with other color light emitting devices or adding phosphors to these devices, it is also possible to generate "white light".

The emission pattern of such device may be incoherent as for LEDs, or else be coherent for LDs. The electronic devices may also include high electron mobility transistors (HEMT), heterojunction bipolar transistors (HBT), Schottky, p-i-n and metal-semiconductor-metal (MSM) photodiodes and others as will be appreciated by those skilled in the art. The devices may be ultra-thin and free from the original substrate. They may be bonded to a metal or semiconductor base with high electrical and thermal conductivity. Efficient heat removal enhances the device performance and allows the fabrication of large area devices.

A new method for mass producing ultra-thin GaN LEDs and LDs is described. The technology is able to produce LEDs and LDs with the wavelengths of emission that vary from deep UV to green or beyond depending on the composition of the film. The method permits the production of free-standing ultra-thin epitaxial films without the attachment to the original substrate, and with great flexibility in chemical composition including but not limited to the simple GaN and AlN binary, AlGaN, InGaN ternary and even AlInGaN quaternary systems. The method also permits fabrication of very large area LEDs which conventional technology is incapable of producing. Large area LEDs greatly reduce the manufacture cost and are able to produce higher brightness than the conventional LEDs.

Figure 1:
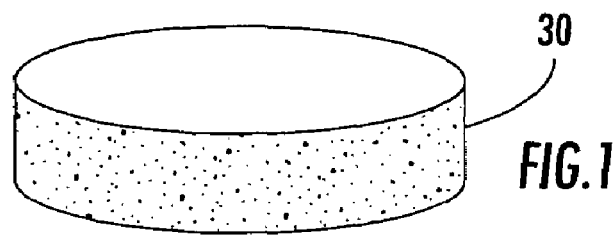
FIGS. 1 through 7 are schematic perspective views during manufacture of the devices in accordance with the invention.

The growth process may start with a polished (100) orientation LAO single crystal wafer 30 (FIG. 1). The surface of the wafer 30 is fully cleaned. The LAO wafer 30 is then placed in an MOCVD (metal-organic chemical vapor deposition) reactor, not shown, and heated to a temperature from 700 up to 1,200° C. to grow a GaN epitaxial film 32 (or AlGaN, InGaN, and AlInGaN epitaxial films with specific Al, In and Ga metal ratios). However, MOCVD is not the only method able to grow GaN epitaxial film. Other feasible growth methods include MBE (molecular beam epitaxy), ALE (atomic layer epitaxy), HVPE (hydrite vapor phase epitaxy), etc.

The structure and composition of the epitaxial film 32 depends on the specific device intended to be made. One important feature is that the GaN epitaxial film 32 grown on (100) LAO substrate 30 is in (1010) or m-plane orientation which is distinctively different from the (0001) GaN films grown on all the rest of the known substrates including sapphire, SiC, GaAs and Si. LAO is the only substrate currently known to produce the m-plane epitaxial film.

Here, let us first consider the typical blue, green visible LEDs. A thin (<50 nm) temperature buffer layer of AlN, AlGaN or InGaN 31 may first be deposited on the LAO wafer 30 to help for the adhesion of the epitaxial film 32. Even though AlN is used as a buffer layer for the growth of GaN on sapphire, an AlGaN or InGaN layer may be preferred as the buffer layer for the LAO substrate 30. The reason is that it can provide a conducting base which is desired in LED and LD devices. Moreover, AlN has the worst lattice matching to the LAO substrate 30, but it is perfectly usable as a buffer layer 31. $Al_{0.7}Ga_{0.3}N$ has the exact lattice match to LAO along the a-axis whereas pure InGaN gas the best lattice matching to the c-axis.

In principle, any AlGaN composition can be used as the buffer layer. To make the perhaps the best compromise for lattice matching, $Al_{0.3}Ga_{0.7}N$ may be the best composition. The temperature of deposition of this buffer layer 31 can vary from 500° to 1000° C. However, since the lattice matching of the substrate 30 to the epitaxial layer 32 is very good, higher temperature (900° C.) deposition of the buffer layer 31 is preferred. This is distinctively different from other prior art since the prior art typically requires starting with a low temperature (550° C.) buffer layer. They include the growth on sapphire, GaAs, Si and SiC substrates.

After the growth of the buffer layer 31, the temperature may be raised to 950° to 1150° C. to grow the first layer of GaN film n-doped with Si 32a. The thickness can vary from a few hundred nm to a few μm. In the prior art, because the removal of the substrate 30 is destructive by either mechanical grinding or laser ablation, a thicker GaN film is needed to ensure that the remaining epitaxial 32 film will not be damaged during the process of substrate removal. In accordance with the present invention, the process to remove the LAO substrate 30 does not damage the epitaxial film 32 as will be described in greater detail below. Therefore, there is no reason to grow very thick layers of either undoped or n-doped GaN. The preferred n-doped layer 32a thickness may be around 800 nm to 2 μm.

Figure 2:
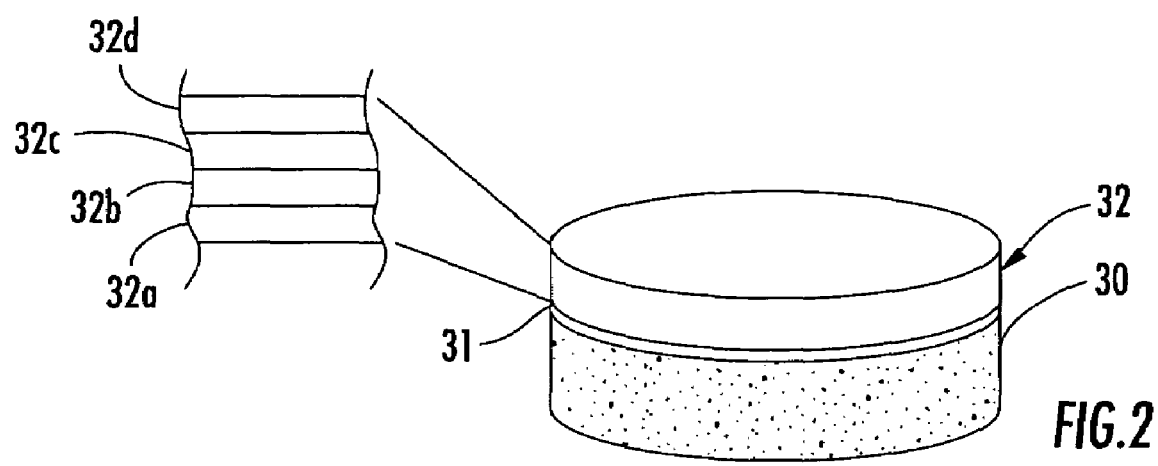

After completing the growth of n-doped GaN layer 32a, one can start the growth of multi-quantum well structures 32b with alternative thin layers of undoped InGaN 32b and GaN 32c as shown in FIG. 2. The thickness of the quantum well structure can vary from 1 to 10 nm for both the InGaN well 32b and the GaN barrier 32c. The preferred thickness may be about 2 nm for the well and 5 nm for the barrier. After the growth of quantum well, an Mg doped p-type GaN layer 32d will be grown as the cap layer. The thickness of the p-layer 32d may again be in the range of a few hundred nm to a few μm. Then the basic p-n junction GaN diode structure is made.

To make an LD, one may increase the thickness of the p-layer 32d. This is because it may be desired to make a reverse mesa structure in contrast to the conventional one as will be explained further below.

Figure 3:
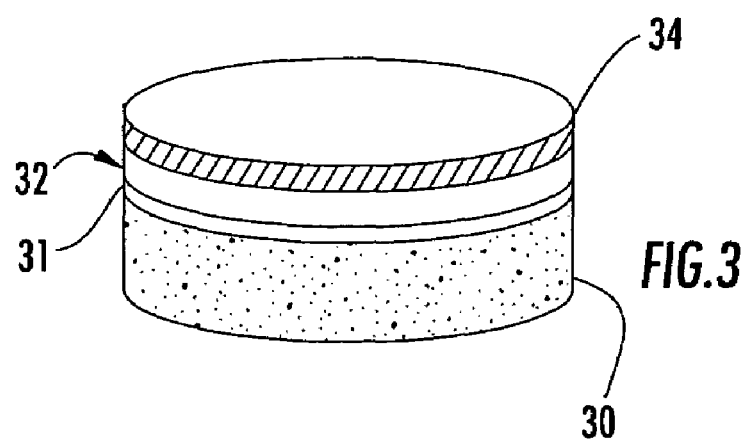

After completion of the epitaxial growth, the LAO wafer 30 with the GaN epitaxial film 32 is then removed from the MOCVD reactor (FIG. 2). It can be placed in a metal evaporator to coat the whole top GaN surface with Ni (around 20 nm) and Au (around 150 nm) thin films to make the p-type Ohmic contact 34 (FIG. 3).

Figure 4:
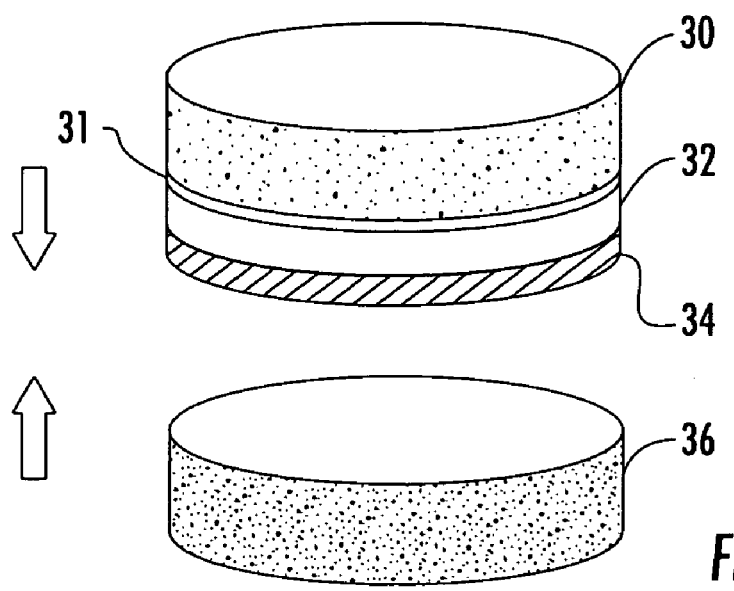

The metal coated surface layer 34 of the LAO wafer 30 is then bounded to a highly polished flat metal or Silicon wafer base 36 which can accommodate the whole typically 2 inch diameter size of the LAO wafer as shown in FIG. 4. This metal or silicon base 34 serves both as the electrical contact as well as the heat sink. There can be a large number of metals suitable for such application, such as, for example, Cu, Ag, Au, Al, Cr, Ni, Ti, Mo, W, Zr, Pt, and Pd.

Even though Si may not technically be considered a metal, it is readily available and inexpensive. The linear thermal expansion coefficient is slightly smaller ($4.7 \times 10^{-6}/°$ K) to that of GaN ($5.6 \times 10^{-6}/°$ K) and the thermal conductivity of 80–150 W/m° K) is also acceptable. It is one of the choice as adhesion base. All these metals can be used as the base 36 for the LED with different engineering requirements because of the drastically different physical properties. The selection of the metal base 36 depends on the thermal and electrical conductivity, the thermal expansion coefficient, the acid corrosion resistance and finally the ductility of the metal and the ease of bonding. Most metals have much higher thermal expansion coefficients such as Al ($23.5 \times 10^{-6}/°$ K), Ag ($19.1 \times 10^{-6}/°$ K) and Cu ($17.0 \times 10^{-6}/°$ K). Others have much more reasonable thermal expansion coefficients, such as Mo ($5.1 \times 10^{-6}/°$ K), W ($4.5 \times 10^{-6}/°$ K) and Zr ($5.9 \times 10^{-6}/°$ K). The rest are in between.

A large mismatch in thermal expansion can cause the fracture of the GaN film 32 during any heating process, such as to make a good Ohmic contact 34. In addition, it may also be desired to consider the metal bonding and etching resistance and the nature of alloying among different metals.

Finally, it may also be desirable to consider the ductility (or molassity) of the metal. Since it is generally desired to dice the GaN film 32 plus metal base 36 into individual chips with a very thin diamond saw, it is preferred to avoid the dress up of the saw blade with the cutting metal. There are specific steps that can be done to minimize such a potential problem. Moreover, this metal base 36 may be pre-textured in such a way so that it can be easily broken up into smaller chips of specific size to simplify the process of making LEDs or LDs as will be appreciated by those skilled in the art.

It may be desired that the pre-textured metal base 36 be aligned with the a- and c-axis of the LAO wafer 30 (which in turn aligns with the c- and a-axis of GaN) so that when it breaks into smaller pieces, the cleavage plane of GaN is in alignment with the edge of the metal base.

The thickness of the metal base 36 can vary from 50 to 500 μm thick. Perhaps the most desirable metal base 36 material may be Cu (copper) because it is highly thermally and electrically conductive, inexpensive and readily available. But Cu has the problem of poor acid etching resistance, thus, a special procedure may be needed to seal the copper from contact with the acid during the etching process.

A next preferred choice may be either Si (silicon), Ag (silver) and/or Mo (molybdenum). These three materials have very different properties, but they share one common property of acid resistance. Therefore, the procedure developed for one metal can be adapted for others. The difference is the nature of metal bonding and ductility of the material. For illustration, we select Ag as the metal for the base 36. The same procedure can also be applied with Si or Mo as the base metal.

Figure 5:
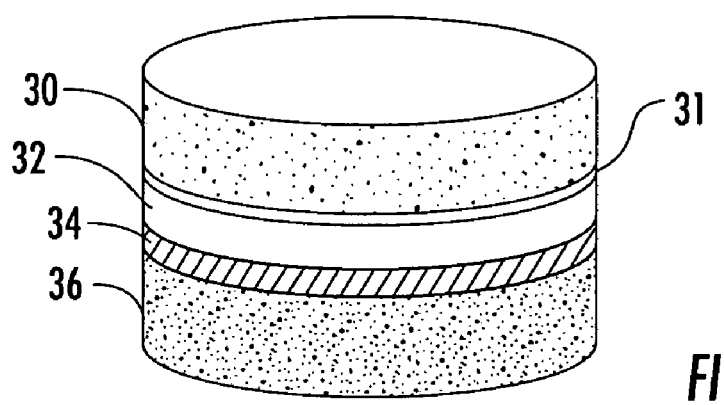

An Ag metal sheet of 100 μm thick is cut in the shape of a 2 inch diameter round disk 36. The LAO wafer 30 with the metallized GaN side 34 face down is then thermally bonded to the round Ag metal disk 36 with In (indium) alloys producing the structure show in FIG. 5. Ag is the most electrically conductive (electrical resistivity at 20° C. is 1.63 μΩcm) and also thermally conductive (thermal conductivity is 429 W/m° K) metal. Even though the Ag metal has a comparatively larger thermal expansion coefficient ($19.1 \times 10^{-6}/°$ K), the bonding temperature may be much lower to address the problem.

Both Si and Mo have a significantly smaller thermal expansion coefficient (4.7 and $5.1 \times 10^{-6}/°$ K, respectively) than other metals and is more comparable to that of GaN, but it requires much higher temperature for the thermal bonding so that the overall effect on differential thermal expansion is comparable to that of the Ag metal. The bonding of Ag, Si or Mo metal base to the Ni—Au coated face has to be very good to avoid peel off later on. Because of the different nature of the metal, different bonding material is used. For the Ag metal base, the preferred bonding material is Indalloy® #3 (90In 10Ag). For Si base, the preferred bonding material is AuIn (gold indium). For the Mo metal base, the preferred bonding material is AuGe (gold germanium).

Figure 6:
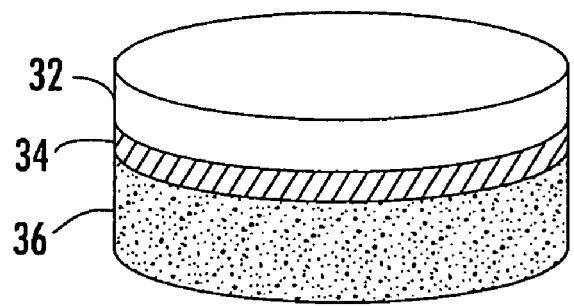

After bonding the Ag metal base 36 on the GaN side 32 of the LAO wafer 30, the whole piece is first placed on a lapping machine to grind most of the LAO substrate off then soaked in warm hydrochloric acid (HCl) to dissolve and remove the remaining LAO substrate 30 (FIG. 6). To protect the bonding metal from being etched away by the corrosive acid, an epoxy may be used to paste around the edge of the wafer 30 as a seal. While it is not difficult to protect the metal edge from acid corrosion, any pinholes or cracks of the GaN film 32 can cause difficulties during the etching period. In this case, we may rely entirely on physical grinding to remove the LAO substrate. Since the adhesion between GaN and LAO is relatively weak, we can effectively remove more than 90% of the LAO substrate by mechanical grinding. The Ag metal has been found to be very resistant to HCl etching. It forms a thin coating of AgCl on surface which can be removed easily with nitric acid (HNO3). A better acid resistant metal with similar properties are Si and Mo. Other metals that resist HCl etching are W (tungsten), Au (gold) and Pt (platinum).

After the HCl etching to remove the LAO substrate 30, only a GaN thin film 32 is left which is bonded to the Ag metal base 36 (FIG. 6). The top surface of the GaN film 32 is n-type. Now it depends on the type of final device to be made, so the whole block can be processed in different ways as outlined below:

(1) Standard Blue LEDs

To make standard blue LEDs, the whole piece shown in FIG. 6 is cleaned and baked dry. The n-type Ohmic contact pads are then formed on the GaN surface. Since only the top side is able to emit light, a patterned contact pad is made to minimize metal coverage and to allow sufficient area to emit the light. The top surface may first be coated with 20 nm Ti and then 150 nm Al metal. Then the surface is spin coated with photoresist. A pattern is made for the Ohmic contact pads. The contact pad geometry can be simple dots, stripes or meanders depending on the size and shape of the LED device. The exposed metal is etched out and the photoresist is stripped out to leave the pad patterns.

Figure 7:
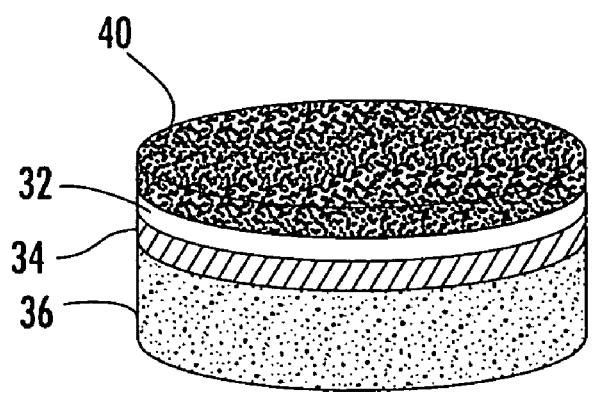
Figure 8:
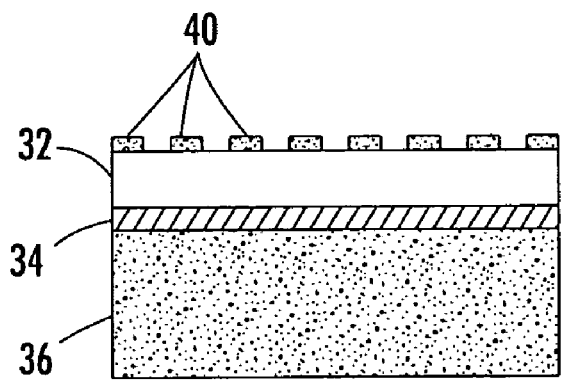
FIGS. 8 through 10 are schematic side elevational views during manufacture of the devices in accordance with the invention.
Figure 9:
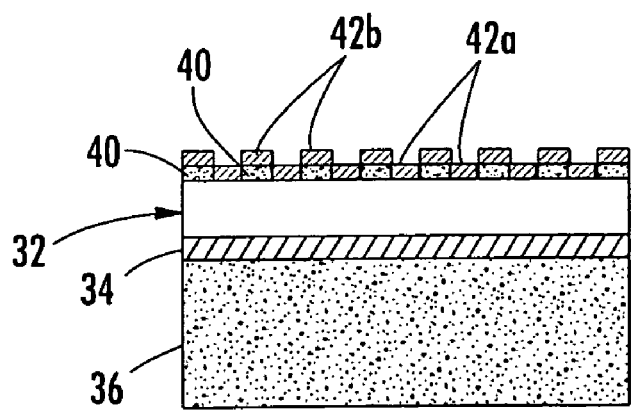
Figure 10:
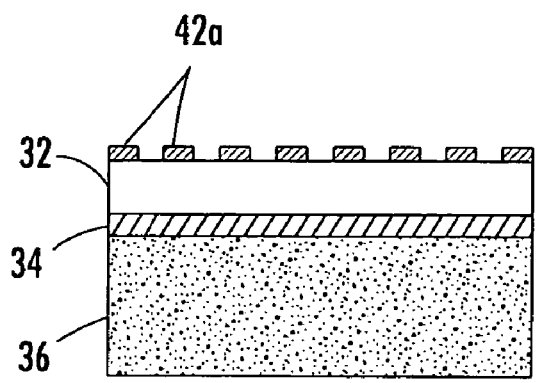
Figure 11:
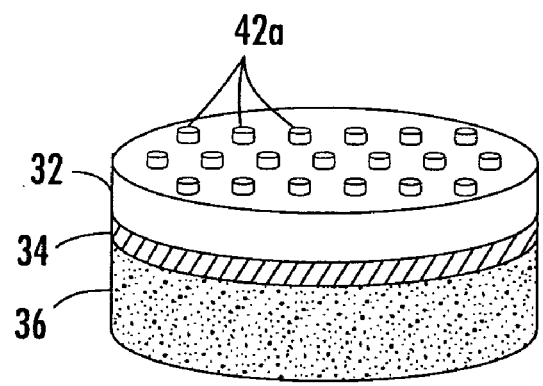
FIGS. 11 and 12 are schematic perspective views during manufacture of the devices in accordance with the invention.
Figure 12:
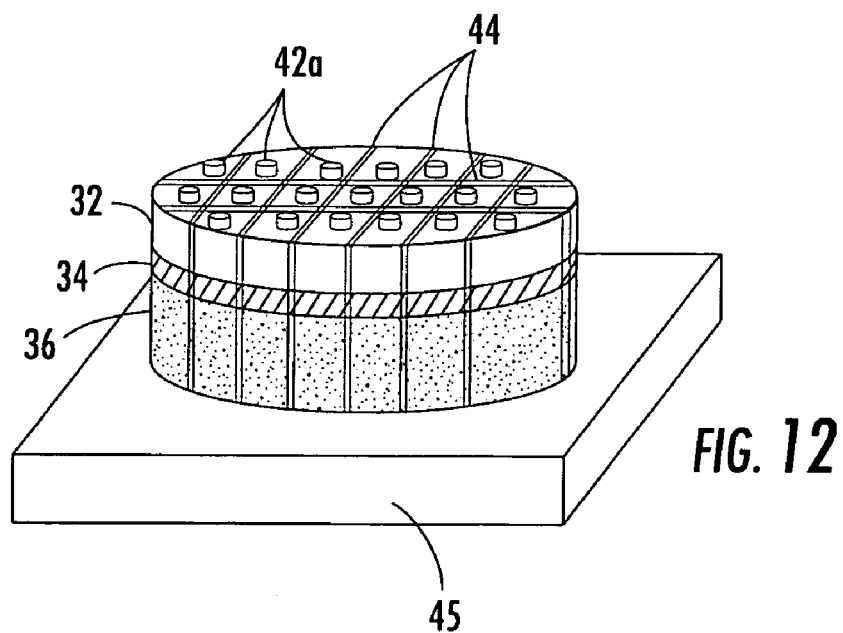

Of course, a lift-off technique may be used by first coating the surface with photoresist 40 (FIG. 7). A pad pattern is made on the photoresist 40 (FIG. 8). The wafer top is then coated with Ti and Al metal coatings defining portions 42a, 42b (FIG. 9). Stripping out the photoresist 40, will produce the contact pads 42a (FIGS. 10 and 11).

The resulting device will have excellent thermal conductivity so that large area devices are feasible (>1 mm$^2$). The final size and shape of the LED chips depend on the application. As long as the device can remove the heat properly, the LED chips can be diced into any geometry, such as a long rod shape. Before dicing into small chips, the Ag metal back is glued onto a glass plate. The dicing process only needs to make cuts 44 into the wafer deep enough to cut through the Ag metal layer into the glass plate 45 (FIG. 11). The glass plate 45 is used to clean the dicing blade and address the metal dressing problem.

For the Si or Mo metal base 36, there is no metal dressing problem. So it is possible to use a stretchable tape instead of the glass plate as will be appreciated by those skilled in the art.

Figure 13:
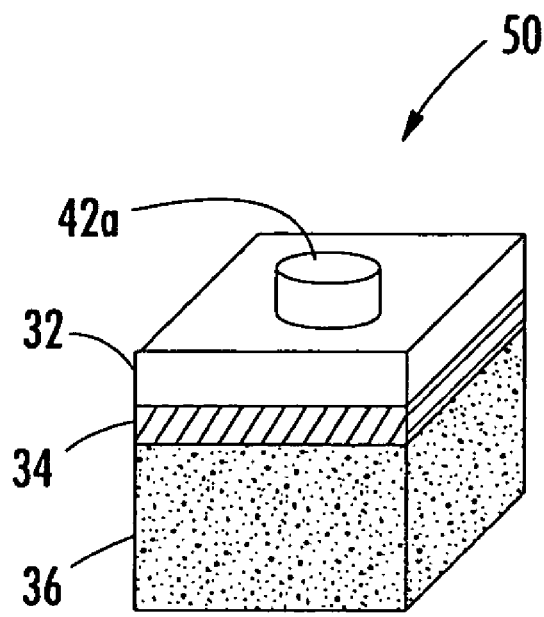
FIG. 13 is a perspective view of an individual device in accordance with the invention after separation from adjacent devices on the wafer.
Figure 14:
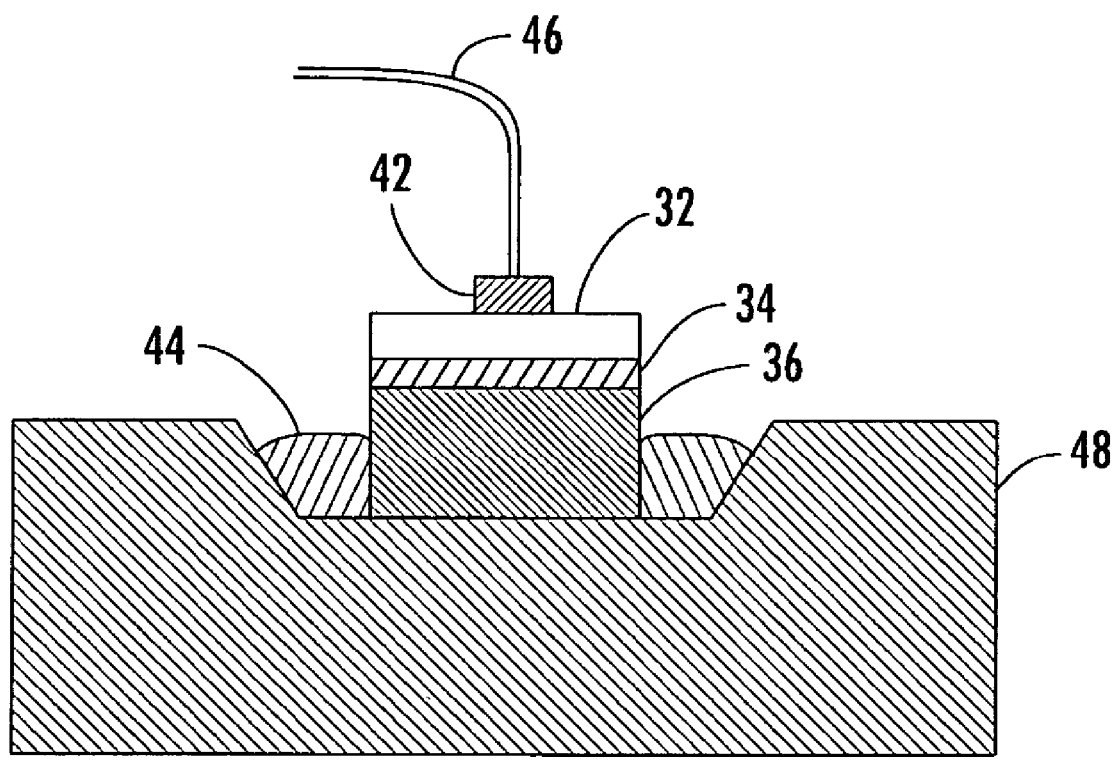
FIG. 14 is a schematic side elevational view of the device as shown in FIG. 13 attached to support.

After the completion of dicing, the diced piece 50 is then cleaned to remove the cutting dust and then dissolved in acetone to release the chip from the glass plate (FIG. 13). For the Si or Mo metal base device, it is possible to stretch the tape and separate all into individual chips. The finished chips can then be collected and mounted into final device packages in the same fashion as the conventional red LEDs. Then the ultra-thin blue LED is produced. To achieve high brightness, effective heat sinking is provided by the heat sink 48 (FIG. 14) that is bonded by metal portions 44 as shown in the illustrated embodiment. A lead 46 is also attached to the upper contact 42a.

(2) High Brightness White LED

To make a high brightness white LED, one can either use the Ce-YAG or Eu—SrAl$_2$O$_4$ or other known ceramic coated phosphor reflector at the back side of the blue LED or deposit a thick layer of n-doped ZnSe on top of the n-doped GaN face. Using a phosphor reflector to generate white light does not need any additional wafer process steps. However for a ZnSe coated layer as a phosphor, an additional deposition process is used.

After the removal of the LAO substrate, the wafer is cleaned and dried and then placed in a ZnSe reactor to coat the surface with an n-doped ZnSe layer on top of the n-doped GaN layer. The ZnSe layer can absorb the blue light emitted by GaN and, in turn, emits its own yellow light which is then mixed with the GaN blue to give the white light.

The thickness of ZnSe is desirably controlled so that it will have the correct absorbency and thus correct white color. In this case, the n-side Ohmic contacts can be made on top of the ZnSe film. The rest of the deposition process is very similar to what has described in the previous paragraph. The subsequent procedures to dice the wafer and to make individual LEDs are similar to section (1) above.

A Ce-doped YAG or Eu-doped SrAl$_2$O$_4$ ceramic reflector is not temperature sensitive, so that there is no change in the appearance of white light with respect to light intensity (or the driving current). On the other hand, ZnSe's emission is very temperature sensitive. It red shifts with increasing temperature. So the overall appearance of the white light is also red shifted with increasing intensity (or temperature). Since the device in accordance with the invention may have a very large highly thermally conductive metal base to remove the heat, the overall device temperature variation is much less. This will significantly reduce the effect of color shift as will be appreciated by those skilled in the art. Moreover, Applicant believes that the device is the first combination of a ZnSe—GaN n-n-p device.

(3) LD

The LD configuration will be in reverse to the conventional one which has an n-type GaN base and a p-type GaN mesa. In this case, the device will have a p-type GaN base and an n-type GaN mesa. The basic fabrication procedure is essentially the same as those described above. Unlike the conventional LD design, the thick film is not needed.

To prevent the leakage of the light, the conventional LD design needs a thick AlGaN cladding layer with a high Al content for optical confinement. To prevent cracking of the MQW (multiple quantum well) structure, GaN/AlGaN MD-SLS (modulation doped strained-layer superlattice) layers were grown on both sides of the MQW. In accordance with the invention, the whole top of the n-type GaN surface will be metallized for the n-side Ohmic contact.

Instead of using MD-SLS for optical confinement, the invention uses the metallized Ohmic contact films on both p- and n-sides for optical confinement. After the top of the n-type GaN surface is coated with Ti and Al metal for the Ohmic contact, the surface is then patterned with a photoresist to mark the location of each laser diode. The Ohmic contact pattern is aligned with the cleavage plane of GaN film, so that it is possible to cleave the GaN film to form a resonant cavity for a laser application.

RIE (reactive ion etching) may be used to make the mesa structure. The etching will go through the p-layer of GaN to reach the metal base. The side of the mesa will be clad with an absorbent material such as $SiO_2$ to prevent reflection.

The wafer is then diced through the metal base into the supporting glass plate following the pattern produced by the REI process. After cleaning to remove the cutting dust, the glass plate is placed in a solvent to dissolve the epoxy and to release the LD chips. These chips are cleaned, dried and then cleaved on both ends along the (0001) plane to produce the resonant cavity.

A high reflection coating (made of pairs of the quarter-wave $TiO_2/SiO_2$ multilayers) may be needed for the two cleaved GaN surfaces to reduce the threshold of lasing current. These chips are then ready to be mounted to complete the laser diodes.

We have described the detailed process to produce visible light and white light LEDs and visible light LDs. To produce the UV LEDs and LDs, the general procedure is essentially the same as the one making the visible devices, except that the basic film composition is AlGaN rather than GaN. Increasing the Al content will increase the band gap of AlGaN film, but at the same time, the electrical resistivity of the film will also increase.

Pure AlN is an insulator so there is a limit to the maximum Al content before the device will be too resistive to function. This limit is normally set to around 50% of the Al content in AlGaN films. Since the lattice constant of LAO is slightly smaller than GaN, it actually fits better with AlGaN composition. To make the UV LEDs, after the initial growth of a thin (<50 nm) AlGaN buffer layer at 900° C., an n-doped AlGaN is deposited at 1000° to 1200° C. Similar to the visible LEDs, the preferred n-doped layer thickness is also around 800 nm to 1 µm.

The multi-quantum well structure is made of alternating thin layers of GaN/AlGaN. The thickness of this quantum well structure will only be a couple of nm. It is known that there is a large built-in electric field (~1 MV/cm) due to spontaneous polarization and piezoelectric effect in the conventional growth on sapphire and SiC with c-plane (0001) film orientation. This may lead to the red shift caused by the quantum confined Stark effect. Since the film in accordance with the invention is grown along the non-polar m-plane (1010) direction, there is no such red shift under high intensity of excitation.

After the growth of quantum well, an Mg doped p-type AlGaN will be grown as the cap layer. The preferred thickness of the p-layer is also a few hundred nm only. Then the basic p-n junction UV AlGaN diode structure is made.

After the growth of the p-n junction structure, the rest of the device manufacturing process is exactly the same as that of visible LEDs. The emission of the UV light is through the n-doped GaN layer. There is a very minimum blockage of the emitted light due to the Ti—Al electric Ohmic contact pads. To make the UV LDs, the procedure is again the same except that the composition of the film is changed from GaN to AlGaN.

Compared with the current conventional LEDs and LDs made on sapphire and SiC, the design of the devices in accordance with the present invention have shown many unique features and advantages as set forth below.

(1) An important feature of the LED and LD devices is the ultra-thin structure of GaN film without the original substrate attached to it. The total device thickness can be as thin as 1 µm or less. No other technology today is believed able to make such a thin free-standing GaN device. The ultra-thin structure helps for the heat dissipation especially when the device is bonded to a highly heat-conductive metal base.

(2) There is no blockage of light for emission. Both of our LED and LD designs are flip-chip designs with the more transparent n-doped GaN side on top to emit light directly. Proper metallization on the back side of the LED can further increase the reflectivity and thus the total light output.

(3) The LEDs and LDs include a very thin GaN film bonded on top of a highly heat-conductive metal base. There is excellent heat sinking at the base of the device so that it can be driven harder with higher electric current than the existing sapphire or even SiC based LEDs and LDs.

(4) The LEDs and LDs use the full metal base electrical contact to the p-doped GaN layer. This will significantly reduce the effect of low carrier concentration and the low two-dimensional sheet current of the p-doped layer.

(5) The good lattice matching with relatively low defect density, as compared to GaN film on sapphire and SiC, permits the device to be driven with higher current to produce higher brightness.

(6) The size of our LEDs can have much larger emitting surface than the existing ones on sapphire or SiC, since the heat sink is in the entire base of the device. The current flow is not a problem since the whole metal base is an electrode. The ultimate size of the device is limited only by the limit of heat removal by the metal base. Moreover, the shape of the LEDs is no longer limited to a square piece. We can make long bar LEDs. Its length is only limited by the diameter of the original substrate wafer. This will provide unique illumination which is not achievable with the existing LEDs.

(7) The structure of the device is well-suited for UV LEDs and LDs since there is no difficulty in starting the growth with AlGaN layer instead of GaN layer so that the device is transparent to the UV light. Moreover, since our film is an m-face film which is non-piezoelectric so there is no quantum confined Stark effect. The emitting wavelength of our device will stay constant regardless the power of the device.

(8) The structure provides naturally cleaved surfaces for the laser cavity.

(9) No ELOG (epitaxial lateral over-growth) or other complicated lithographic or etching processes are needed. The overall device fabrication procedure is much simpler. The LED has the conventional mounting design which is identical to that of red GaAs based LEDs and LDs so that the device can be fully integrated with GaAs based LEDs on a chip level before packaging to make LED clusters.

The basic procedure to produce epitaxial films of GaN and AlGaN for the manufacture of electronic device such as high electron mobility transistors (HEMT), heterojunction bipolar transistors (HBT), Schottky, p-i-n and metal-semiconductor-metal (MSM) photodiodes, etc., are essentially the same as making epitaxial films of similar composition for LEDs and LDs. The only difference is the detailed sequence of the layered structure. Diodes only need two basic layers, p and n, with quantum wells to control the radiative emission of photons. In the case of HBT or BJT (bipolar junction transistor) devices, three layers are needed with n-p-n, p-n-p or other configurations. The design in accordance with the invention can still provide a full metal base for high thermal removal that is mandatory for any of the high power applications. Moreover, for the MSM structure devices, the process provides the simplest and most straightforward design.

The embodiments of this invention can be divided into two specific steps. The first step is the growth of GaN epitaxial films by MOCVD method. The second step is the manufacture of GaN LED and LD devices from these epitaxial films.

(A) The Growth of GaN Epitaxial Film:

To be able to make GaN LEDs and LDs, we must first have a high quality epitaxial film of GaN with the specific structure interlayers to make the devices. The most basic requirement is that the film should be smooth, specular in appearance and without cracks. Moreover, the film should be able to be attached to the substrate without peel off to allow post growth processing. All the films were grown with an Aixtron 200 HT MOCVD system. Only a single 2" diameter wafer was produced from each growth run. The gas sources of this reactor included nitrogen ($N_2$), ammonia ($NH_3$), hydrogen ($H_2$), silane ($SiH_4$), trimethyl gallium (TMG), trimethyl aluminum (TMA), trimethyl indium (TMIn) and $Cp_2Mg$.

It is fully understood in the art that the growth of a film of a particular composition would require the flow of the proper gas sources to achieve the deposition. For example, the growth AlN layer would require the flow of ammonia and TMA to make the reaction. The growth of GaN layer would require the flow of ammonia and TMG. The growth of InGaN quantum well would require the flow of ammonia, TMIn and TMG. To achieve n-doping would require the flow of silane and p-doping would require the flow of $Cp_2Mg$. So in the following specific examples of embodiments of the invention, no detailed description of the gas flow will be provided.

The gas flow rate and mixing ratio to provide optimized film composition varies from reactors supplied by different vendors. Even for reactors supplied by the same vendor, there are variations among different units.

EXAMPLE 1

Figure 15:
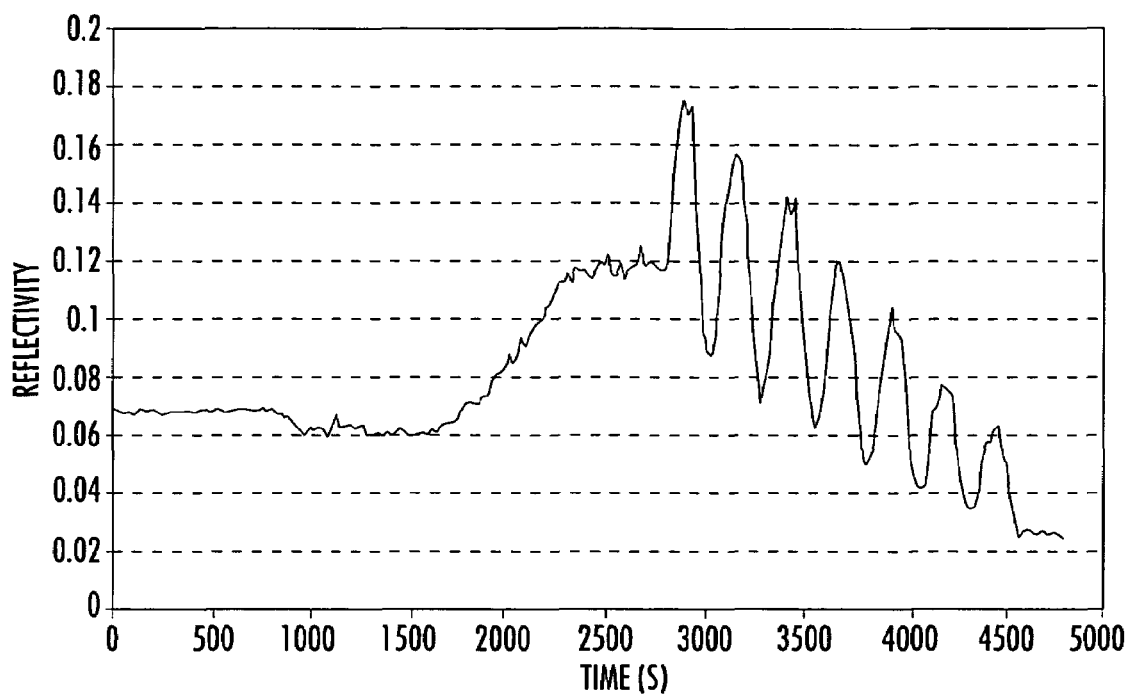
FIG. 15 is a graph of reflectometry data for a device in accordance with a first example of the invention.

The LAO wafer is cleaned and placed in the Aixtron 200 HT MOCVD reactor. The growth process follows the standard GaN growth procedure on sapphire. The substrate was first preheated to 1050° C. for 10 minutes under a nitrogen atmosphere. The temperature is lowered down to 580° C. and an AlN low temperature buffer layer of 50 nm in thickness is grown on the LAO wafer. Afterward, the temperature is raised to 950° C. and 800 nm of undoped GaN is grown on top of the AlN buffer layer. The reflectometry result is shown in FIG. 15. The film is smooth in appearance and there is no peel-off.

However, TEM (transmission electron microscopy) shows quite a different result. The AlN layer is poorly crystallized and it provides the nuclei for the growth of GaN film on top of it. Since the preferred orientation of the AlN nuclei is along the c-axis [0001] direction, as a result, the GaN film is c-plane (0001) film and not the m-plane (1010) film. So there is no epitaxial relationship of the GaN film and the LAO substrate. The film shows a high defect density because of the low temperature AlN buffer.

EXAMPLE 2

Figure 16:
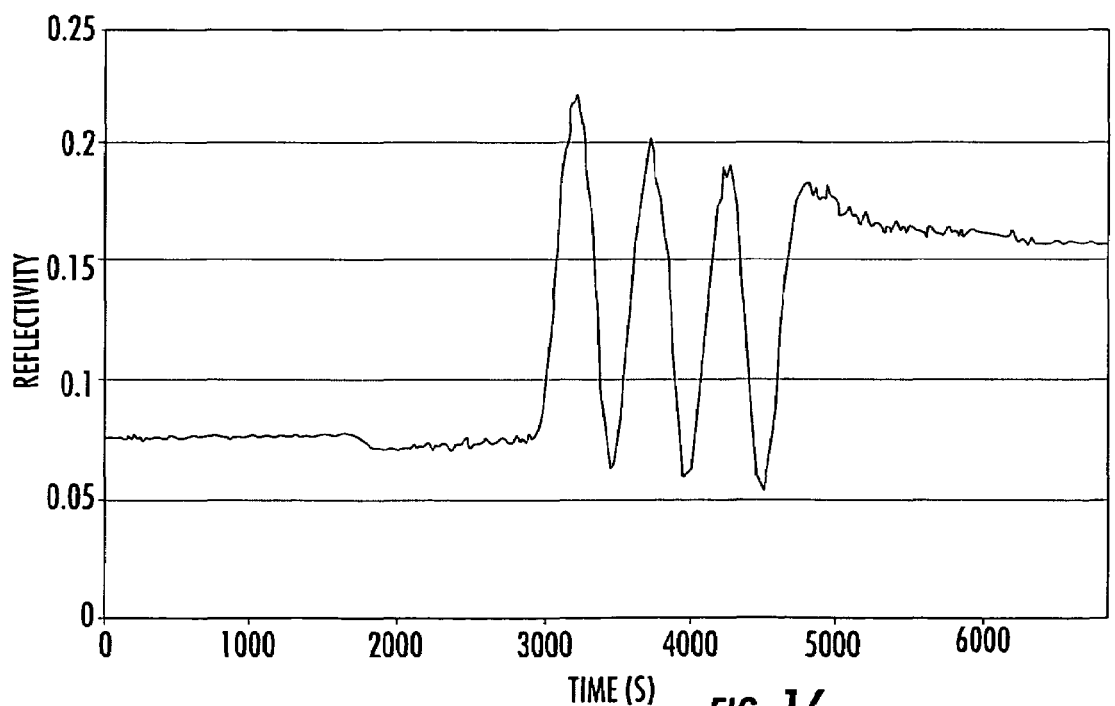
FIG. 16 is a graph of reflectometry data for a device in accordance with a second example of the invention.

A new LAO wafer is cleaned and placed in the Aixtron 200 HT MOCVD reactor. We change the growth procedure following our recipe. First, we eliminate the step of 10 minutes of preheating of the substrate to 1050° C. Instead, we heat the wafer directly to 900° C. and then start the deposition of AlN film at this high temperature. After the growth of a 50 nm high temperature AlN buffer layer, we raise the temperature to 950° C. and 800 nm of n-doped GaN:Si layer is grown on top of the AlN layer. The reflectometry data (FIG. 16) which monitors the smoothness of the film during growth shows great improvement of the film quality and is distinctively different from that of Example 1.

The film is specular and there is no peel-off after cooling down to room temperature. The Si doping has no effect on the quality of the film. When looked under microscope, the GaN film is very uniform and there is no crack found in the film. This is consistent with the fact that GaN has smaller thermal expansion coefficient than LAO so that the GaN film is always under tension during cooling.

The TEM (transmission electron microscopy) shows that the AlN layer is crystalline and very thin. We suspect that it may form alloy with GaN at the interface. The film is more uniform and has less defects because of the better crystallinity of the AlN buffer layer.

EXAMPLE 3

Once the basic growth process of n-doped GaN:Si epitaxial film is established, we proceed with the growth of GaN film with the full p-n junction and quantum well structure. A new LAO wafer is cleaned and placed in the Aixtron 200 HT MOCVD reactor. We use the growth procedure established in Example 2 for the growth of full structure GaN film. The wafer is heated directly to 900° C. and then starts the deposition of 50 nm thick AlN high temperature buffer layer. After the growth AlN buffer layer, the temperature is raised to 950° C. to grow 800 nm thick of n-doped GaN:Si layer. After that, we grow the quantum well structure which consists of two pairs of 10 nm undoped GaN barrier and 5 nm InGaN well. On top of it, we grow a 10 nm AlGaN barrier layer before the growth of the final 200 nm p-doped GaN:Mg cap layer.

Figure 17:
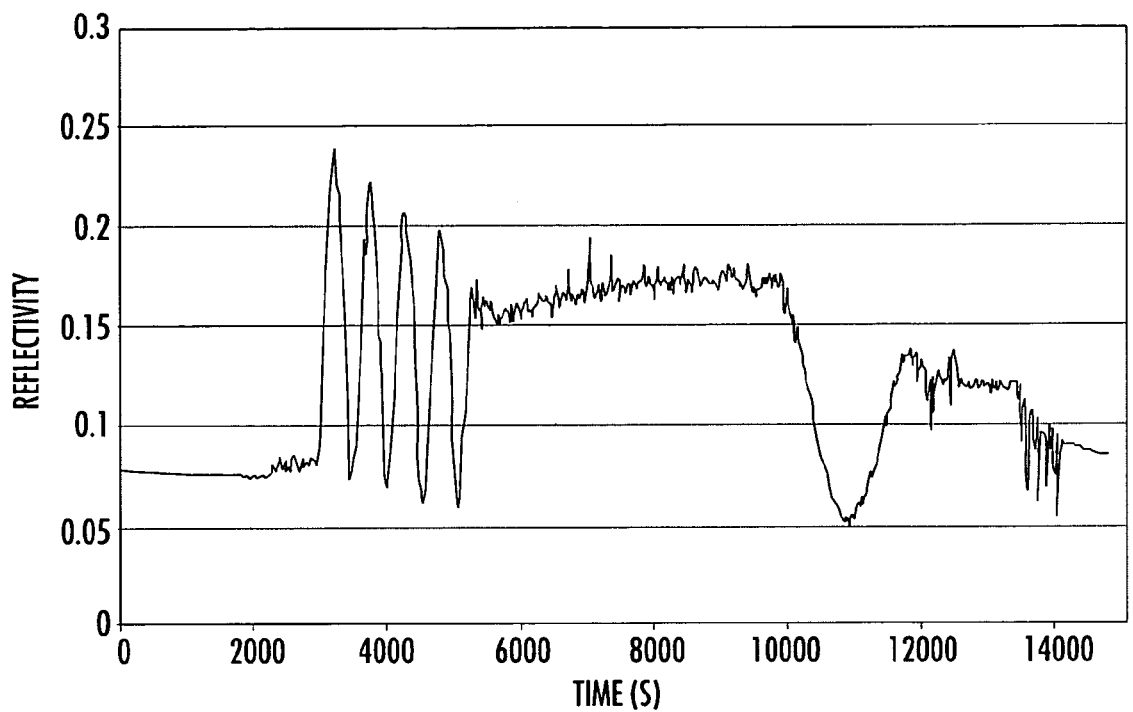
FIG. 17 is a graph of reflectometry data for a device in accordance with a third example of the invention.

The reflectometry data (FIG. 17) shows excellent growth conditions. After the completion of the growth of p-n junction plus multiple quantum well structure, the furnace temperature is dropped down to 750° C. for 40 minutes to thermally anneal and activate the p-doped GaN:Mg layer. After the thermal annealing, the reactor is cooled down to room temperature. Similar to Example 2, the GaN film on LAO is also smooth and specular. There are no cracks found in the finished film over the entire 2" wafer. This wafer is ready to make LED devices.

EXAMPLE 4

The previous three examples illustrate the process to grow the full structure GaN films for visible LED and LD devices. This example will show the feasibility to make UV LED and LD devices. This means that we need to grow AlGaN films on LAO. The unit cell lattice dimension of AlN is smaller than GaN with a-axis=3.112 Å and c-axis=4.995 Å. Compared with the lattice dimension of LAO, the lattice constants are also smaller. The mismatch is −0.7% along a-axis and −3.5% along c-axis. In fact, AlN has the worst lattice match in the AlN-GaN solid solution composition range. AlGaN with about 30% Al has overall the best lattice match to LAO.

Therefore, to test the ability to grow thick AlN film on LAO, we will provide the necessary information for the feasibility to grow AlGaN epitaxial films for UV LEDs and LDs. A new LAO wafer is cleaned and placed in the Aixtron 200 HT MOCVD reactor. The wafer is first heated directly to 900° C. We then start the deposition of AlN buffer layer film at this temperature. After the growth of the 50 nm AlN buffer layer, we raise the temperature to 950° C. and continue the growth of AlN film at this temperature. The total finished AlN film is about 350 nm.

Figure 18:
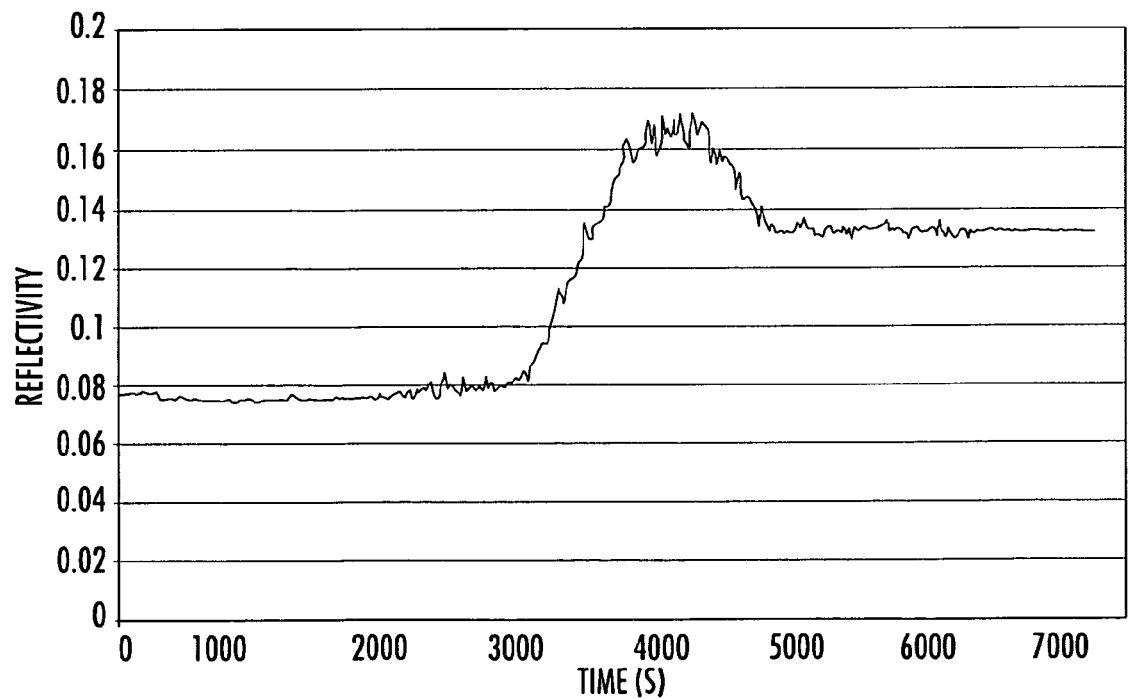
FIG. 18 is a graph of reflectometry data for a device in accordance with a fourth example of the invention.

The reflectometry data is shown in FIG. 18 and it is excellent. After cooling down to room temperature, the AlN film is uniform and specular. Again, we found no visible cracks of the entire 2" AlN film when examined under a microscope. We now have demonstrated the growth of undoped AlN film. Similar to the case of GaN, we should be able to grow AlGaN films on LAO.

(B) Manufacture of GaN LED and LD Devices:

After completion of the growth of the full p-n junction and quantum well structure epitaxial film as illustrated in example 3 of the previous section, the LAO wafers with GaN epitaxial film are then removed from the MOCVD reactor and ready for the manufacture of the LED devices. The wafer is placed in a metal evaporator and the whole top of the GaN surface is coated first with approximately 20 nm thick of Ni and then approximately 150 nm thick of Au thin films to make the Ohmic contact for the p-GaN layer.

A highly polished flat Ag metal sheet of 100 μm thickness is cut in the shape of a 2" diameter round disk. The LAO wafer with the metallized GaN side face down is then thermally bonded to the round Ag metal disk with indium metal. The whole assembly is pressed during the thermal bonding with proper weight to ensure good physical contact after curing.

After the LAO wafer is tightly bonded to the Ag metal disk, epoxy is applied to the edge of the LAO wafer in contact with the Ag metal. It will seal off the edge of the metal disk for the subsequent acid etching process. Once the epoxy is cured, the whole piece is then soaked in a warm 50% diluted hydrochloric acid (HCl) to dissolve and remove the LAO substrate. After the LAO substrate is removed by HCl etching, the wafer is rinsed with dilute nitric acid to remove AgCl on the Ag metal surface. Then only GaN thin film is left which is bonded to the Ag metal base by indium alloy. The GaN film is now flipped with respect to the supporting plate. The top surface of the GaN film is n-type.

The whole piece is rinsed to remove the acid, cleaned and baked dry. Then the GaN film surface is ready to make the Ohmic contact pads for the n-doped side. Here we use the lift-off technique to make the contact pads. The GaN film surface is spin-coated with photoresist. A pattern is made for the Ohmic contact pads. For simplicity, we made very large 100 μm round dots for contact pads. In real devices, both the size and the shape of the electric contact pads can vary to meet the need.

Since our device will have excellent thermal conductivity, large area devices are feasible (>1 $mm^2$). We made the pattern such that the center-to-center spacing of the contact pads is 1.5 mm. Once the pattern is exposed the UV light, the unexposed photoresist is stripped to expose the pad region. We then make the n-type Ohmic contact pads by first coating with 20 nm Ti and then 150 nm Al metal. By stripping out the photoresist along with the metal film on top of the photoresist, we will have the Ti—Al metal contact pads left on the GaN film for n-doping side electrode.

Now the construction of the device structure is complete. The backside of the wafer is taped with a stretchable tape and then placed under a dicing machine to cut the wafer into final chip sizes. The dicing process will cut through the GaN film layer and the Ag metal base layer, but not through the stretchable tape. The cutting is made such that the Ti—Al contact pads are located at the center of the chip. The diced plates are cleaned to remove the cutting debris and then stretched to separate the individual chips which are still on the tape. The finished chips will break loose from the stretchable tape and are ready to be mounted in the same fashion as the conventional red LEDs, and the ultra-thin blue LED is produced.

Testing the chip is made with a 12V DC battery source. Blue light is emitted when the battery is electrically connected to the device. The embodiment illustrated here is one of the simplest LED designs without the use of any high resolution and more sophisticated equipment. Many modifications and other embodiments of the invention may come to the mind of any skilled person in the art after review the disclosure and the associated embodiments. Therefore, it is to be understood that the invention is not to be limited to the specific embodiments disclosed, and that modifications and other embodiments are intended to be included within the scope of the appended claims.

That which is claimed is:

1. A method for making at least one semiconductor device comprising:
    providing a sacrificial growth substrate comprising Lithium Aluminate ($LiAlO_2$);
    forming at least one semiconductor layer comprising a Group III nitride adjacent the sacrificial growth substrate;
    attaching a mounting substrate adjacent the at least one semiconductor layer opposite the sacrificial growth substrate; and
    removing the sacrificial growth substrate.

2. A method according to claim 1 further comprising adding at least one contact onto a surface of the at least one semiconductor layer opposite the mounting substrate.

3. A method according to claim 2 further comprising dividing the mounting substrate and at least one semiconductor layer into a plurality of individual semiconductor devices.

4. A method according to claim 3 further comprising bonding the mounting substrate of each individual semiconductor device to a heat sink.

5. A method according to claim 4 wherein the heat sink comprises copper (Cu) block.

6. A method according to claim 1 wherein removing comprises mechanical grinding and wet etching the sacrificial growth substrate.

7. A method according to claim 6 wherein the mounting substrate is resistant to the wet etching.

8. A method according to claim 6 further comprising protecting at least portions of the mounting substrate during wet etching.

9. A method according to claim 1 wherein the sacrificial growth substrate comprises single crystal $LiAlO_2$.

10. A method according to claim 1 wherein the at least one semiconductor layer comprises at least one single crystal gallium nitride (GaN) layer.

11. A method according to claim 1 wherein attaching the mounting substrate comprises:
    forming an adhesion layer on the at least one semiconductor layer; and
    bonding the adhesion layer to the mounting substrate.

12. A method according to claim 11 wherein the adhesion layer comprises at least one of nickel (Ni) and gold (Au).

13. A method according to claim 11 wherein the mounting substrate comprises at least one of copper (Cu), silver (Ag), gold (Au), aluminum (Al), chromium (Cr), nickel (Ni), titanium (Ti), molybdenum (Mo), tungsten (W), zirconium (Zr), platinum (Pt), palladium (Pd), and silicon (Si).

14. A method according to claim 1 wherein forming the at least one semiconductor layer comprises doping the at least one semiconductor layer.

15. A method according to claim 1 further comprising forming a buffer layer between the sacrificial growth substrate and the at least one semiconductor layer; and wherein removing the sacrificial growth substrate further comprises removing the buffer layer.

16. A method according to claim 1 wherein the at least one semiconductor layer has an m-plane (1010) orientation.

17. A method according to claim 1 wherein the at least one semiconductor layer has a thickness of less than about 10 µm.

18. A method according to claim 1 wherein the at least one semiconductor layer emits light upon being electrically biased.

19. A method for making a plurality of semiconductor devices comprising:
  providing a sacrificial growth substrate comprising Lithium Aluminate (LiAlO$_2$);
  forming at least one semiconductor layer comprising a Group III nitride adjacent the sacrificial growth substrate;
  attaching a mounting substrate adjacent the at least one semiconductor layer opposite the sacrificial growth substrate, the mounting substrate comprising at least one of a metal and silicon;
  removing the sacrificial growth substrate using mechanical grinding and wet chemical etch;
  forming a plurality of contacts on the at least one semiconductor layer opposite the mounting substrate; and
  dividing the mounting substrate and at least one semiconductor layer into a plurality of individual semiconductor devices.

20. A method according to claim 19 further comprising bonding the mounting substrate of each individual semiconductor device to a heat sink.

21. A method according to claim 19 wherein the mounting substrate is resistant to the wet etching.

22. A method according to claim 19 further comprising protecting at least portions of the mounting substrate during wet etching.

23. A method according to claim 19 wherein the sacrificial growth substrate comprises single crystal LiAlO$_2$.

24. A method according to claim 19 wherein the at least one semiconductor layer comprises at least one single crystal gallium nitride (GaN) layer.

25. A method according to claim 19 wherein attaching the mounting substrate comprises:
  forming an adhesion layer on the at least one semiconductor layer; and
  bonding the adhesion layer to the mounting substrate.

26. A method according to claim 19 wherein forming the at least one semiconductor layer comprises doping the at least one semiconductor layer.

27. A method according to claim 19 further comprising forming a buffer layer between the sacrificial growth substrate and the at least one semiconductor layer; and wherein removing the sacrificial growth substrate further comprises removing the buffer layer.

28. A method according to claim 19 wherein the at least one semiconductor layer has an m-plane (1010) orientation.

29. A method according to claim 19 wherein the at least one semiconductor layer emits light upon being electrically biased.

30. A method for making at least one semiconductor device comprising:
  providing a sacrificial growth substrate comprising single crystal Lithium Aluminate (LiAlO$_2$);
  forming at least one semiconductor layer comprising a Group III nitride having an m-plane (1010) orientation adjacent the sacrificial growth substrate;
  attaching a mounting substrate adjacent the at least one semiconductor layer opposite the sacrificial growth substrate, the mounting substrate comprising at least one of metal and silicon; and
  removing the sacrificial growth substrate.

31. A method according to claim 30 further comprising:
  adding at least one contact onto a surface of the at least one semiconductor layer opposite the mounting substrate;
  dividing the mounting substrate and at least one semiconductor layer into a plurality of individual semiconductor devices; and
  bonding the mounting substrate of each individual semiconductor device to a heat sink.

32. A method according to claim 31 wherein removing comprises mechanical grinding and wet etching the sacrificial growth substrate; and wherein the mounting substrate is resistant to the wet etching.

33. A method according to claim 31 wherein removing comprises mechanical grinding and wet etching the sacrificial growth substrate; and further comprising protecting at least portions of the mounting substrate during wet etching.

34. A method according to claim 31 wherein the at least one semiconductor layer comprises at least one single crystal gallium nitride (GaN) layer.

35. A method according to claim 31 wherein attaching the mounting substrate comprises:
  forming an adhesion layer on the at least one semiconductor layer; and
  bonding the adhesion layer to the mounting substrate.

36. A method according to claim 31 further comprising forming a buffer layer between the sacrificial growth substrate and the at least one semiconductor layer; and wherein removing the sacrificial growth substrate further comprises removing the buffer layer.

37. A method according to claim 31 wherein the at least one semiconductor layer emits light upon being electrically biased.

* * * * *

UNITED STATES PATENT AND TRADEMARK OFFICE
CERTIFICATE OF CORRECTION

PATENT NO. : 7,033,858 B2
APPLICATION NO. : 10/803467
DATED : April 25, 2006
INVENTOR(S) : Chai et al.

It is certified that error appears in the above-identified patent and that said Letters Patent is hereby corrected as shown below:

| | |
|---|---|
| Column 5, Line 67 | Delete: "do no"<br>Insert: -- do not -- |
| Column 9, Line 5 | Delete: "make the perhaps"<br>Insert: -- make perhaps -- |
| Column 9, Line 63 | Delete: "K) "<br>Insert: -- K -- |
| Column 12, Line 28 | Delete: "has described"<br>Insert: -- has been described -- |
| Column 14, Line 50 | Delete: "device"<br>Insert: -- devices -- |
| Column 16, Line 7 | Delete: " looked under microscope"<br>Insert: -- looked at under a microscope -- |
| Column 16, Line 28 | Delete: "growth AlN "<br>Insert: -- growth of AlN -- |
| Column 17, Line 51 | Delete: " exposed"<br>Insert: -- exposed to -- |

UNITED STATES PATENT AND TRADEMARK OFFICE
CERTIFICATE OF CORRECTION

PATENT NO. : 7,033,858 B2
APPLICATION NO. : 10/803467
DATED : April 25, 2006
INVENTOR(S) : Chai et al.

It is certified that error appears in the above-identified patent and that said Letters Patent is hereby corrected as shown below:

Column 18, Line 10     Delete: "review the"
                       Insert: -- review of the --

Signed and Sealed this

Twenty-sixth Day of December, 2006

JON W. DUDAS
*Director of the United States Patent and Trademark Office*